United States Patent
White et al.

(10) Patent No.: US 7,988,129 B2
(45) Date of Patent: Aug. 2, 2011

(54) FLOATING SLIT VALVE FOR TRANSFER CHAMBER INTERFACE

(75) Inventors: John M. White, Hayward, CA (US); Shinichi Kurita, San Jose, CA (US); Takayuki Matsumoto, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 691 days.

(21) Appl. No.: 12/040,291

(22) Filed: Feb. 29, 2008

(65) Prior Publication Data

US 2008/0258091 A1 Oct. 23, 2008

Related U.S. Application Data

(60) Provisional application No. 60/892,442, filed on Mar. 1, 2007.

(51) Int. Cl.
F16K 3/00 (2006.01)
(52) U.S. Cl. .......................... 251/328; 251/301; 251/326
(58) Field of Classification Search .................. 251/300, 251/301, 326, 328
See application file for complete search history.

(56) References Cited

U.S. PATENT DOCUMENTS

| | | | |
|---|---|---|---|
| 5,857,368 A | 1/1999 | Grunes et al. |
| 5,985,033 A | 11/1999 | Yudovsky et al. |
| 6,024,393 A | 2/2000 | Shamlou et al. |
| 6,045,620 A | 4/2000 | Tepman et al. |
| 6,063,440 A | 5/2000 | Chen et al. |
| 6,092,981 A | 7/2000 | Pfeiffer et al. |
| 6,108,189 A | 8/2000 | Weldon et al. |
| 6,143,086 A | 11/2000 | Tepman |
| 6,199,927 B1 | 3/2001 | Shamlou et al. |
| 6,231,732 B1 | 5/2001 | Hollars et al. |
| 6,248,176 B1 | 6/2001 | Yudovsky et al. |
| 6,294,088 B1 | 9/2001 | Allington et al. |
| 6,414,834 B1 | 7/2002 | Weldon et al. |
| 6,436,192 B2 | 8/2002 | Chen et al. |
| 6,721,162 B2 | 4/2004 | Weldon et al. |
| 2005/0109461 A1 | 5/2005 | Sun |
| 2006/0051966 A1 | 3/2006 | Or et al. |
| 2006/0264043 A1 | 11/2006 | Stewart et al. |

OTHER PUBLICATIONS

International Search Report and Written Opinion dated Aug. 8, 2008 for International Application No. PCT/US2008/055448.

*Primary Examiner* — John Fristoe, Jr.
(74) *Attorney, Agent, or Firm* — Patterson & Sheridan, L.L.P.

(57) ABSTRACT

The present invention generally comprises a floating slit valve for interfacing with a chamber. A floating slit valve moves or "floats" relative to another object such as a chamber. The slit valve may be coupled between two chambers. When a chamber coupled with the slit valve is heated, the slit valve may also be heated by conduction. As the slit valve is heated, it may thermally expand. When a vacuum is drawn in a chamber, the slit valve may deform due to vacuum deflection. By disposing a low friction material spacer between the chamber and the slit valve, the slit valve may not rub against the chamber during thermal expansion/contraction and/or vacuum deflection and thus, may not generate undesirable particle contaminants. Additionally, slots drilled through the chamber for coupling the slit valve to the chamber may be sized to accommodate thermal expansion/contraction and vacuum deflection of the slit valve.

6 Claims, 5 Drawing Sheets

US 7,988,129 B2

FLOATING SLIT VALVE FOR TRANSFER CHAMBER INTERFACE

CROSS-REFERENCE TO RELATED APPLICATIONS

This application claims benefit of U.S. Provisional Patent Application Ser. No. 60/892,442 (APPM/011889L), filed Mar. 1, 2007, entitled "Floating Slit Valve for Transfer Chamber Interface", which is herein incorporated by reference.

BACKGROUND OF THE INVENTION

1. Field of the Invention

Embodiments of the present invention generally relate to a slit valve for interfacing with a transfer chamber.

2. Description of the Related Art

In order to efficiently perform consecutive processes upon one or more substrates, multiple processing chambers may be coupled together. Efficiency is particularly important in semiconductor, flat panel display, photovoltaic, and solar panel manufacturing because it is common to perform numerous consecutive processes upon the substrates. To transfer substrates from one processing chamber to another processing chamber, a transfer chamber may be coupled with one or more processing chambers. The transfer chamber may remove one or more substrates from a processing chamber and transfer the substrate to one or more other processing chambers, another transfer chamber, or even a load lock chamber. A processing chamber may be directly coupled to another processing chamber or a load lock chamber. Additionally, a load lock chamber may be coupled to another load lock chamber.

At each interface between chambers, a slit valve may be present. The slit valve, when opened, permits one or more substrates to be transferred between adjacent chambers. When the slit valve is closed, substrates may not be transferred between the chambers. The slit valve thus may seal the chambers from adjacent chambers so that each chamber may have its own environment isolated from an adjacent chamber.

Therefore, there is a need in the art for a slit valve to provide an effective seal between chambers.

SUMMARY OF THE INVENTION

The present invention generally relates to a floating slit valve for interfacing with a chamber. A floating slit valve moves or "floats" relative to another object such as a chamber. The slit valve may be coupled between two chambers. When a chamber coupled with the slit valve is heated, the slit valve may also be heated by conduction. As the slit valve is heated, it may thermally expand. When a vacuum is drawn in a chamber, the slit valve may deform due to vacuum deflection. By disposing a low friction material spacer between the chamber and the slit valve, the slit valve may not rub against the chamber during thermal expansion/contraction and/or vacuum deflection and thus, may not generate undesirable particle contaminants. Additionally, slots drilled through the chamber for coupling the slit valve to the chamber may be sized to accommodate thermal expansion/contraction and vacuum deflection of the slit valve.

In one embodiment, a slit valve comprises a slit valve body having an opening therethrough. The opening may be sized to permit passage of a substrate through the opening. The body may also have a first groove carved into a surface of the body and circumscribing the opening. The body may also have a plurality of second grooves carved into a same surface of the body as the first groove and disposed radially outside of the first groove. The plurality of second grooves may extend along a substantially linear path. The slit valve may also comprise one or more spacer elements disposed in at least one of the plurality of second grooves.

In another embodiment, an apparatus comprises a transfer chamber, a slit valve, and an O-ring coupled between the slit valve and the transfer chamber. The transfer chamber comprising a transfer chamber body. The transfer chamber body may have a first opening through the transfer chamber body. The first opening may have a first width. One or more second openings may be present through the transfer chamber body. Each second opening may have a second width less than the first width. One or more third openings through the transfer chamber body may also be present. Each third opening may have a third width greater than the second width and less than the first width. The slit valve comprises a slit valve body having an opening therethrough. The opening may be sized to permit passage of a substrate through the opening. The body may also have a first groove carved into the body and circumscribing the opening. The body may also have one or more second grooves carved into the body. One or more spacer elements may be disposed in at least one of the one or more second grooves.

In yet another embodiment, a method of sliding a slit valve along a transfer chamber is disclosed. The method comprises heating a processing chamber and conductively heating the slit valve. The slit valve may be coupled to the processing chamber and the transfer chamber. The method may also comprise expanding the slit valve. The expanding may comprise sliding the one or more spacer elements along a first surface of the transfer chamber. The transfer chamber comprises a first opening through the transfer chamber body. The first opening may have a first width. One or more second openings through the transfer chamber body may also be present. Each second opening may have a second width less than the first width. One or more third openings through the transfer chamber body may also be present. Each third opening may have a third width greater than the second width and less than the first width. The slit valve comprises a slit valve body having an opening therethrough. The opening may be sized to permit passage of a substrate through the opening. The body may also have a first groove carved into the body and circumscribing the opening. The body may also have one or more second grooves carved into the body and one or more spacer elements disposed in at least one of the one or more second grooves.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention will be described below in reference to a slit valve coupled with a transfer chamber and a process chamber. Exemplary transfer chambers, process chambers, and load lock chambers are available from AKT, a subsidiary of Applied Materials, Inc., located in Santa Clara, Calif. It is contemplated that the invention is equally applicable to other transfer chambers, processing chambers, and load lock chambers, including those produced by other manufacturers. Additionally, it is to be understood that while the description discusses a slit valve coupled with a transfer chamber and a processing chamber, the slit valve may be coupled between any two chambers including transfer chambers, process chambers, load lock chambers, and combinations thereof.

Figure 1:
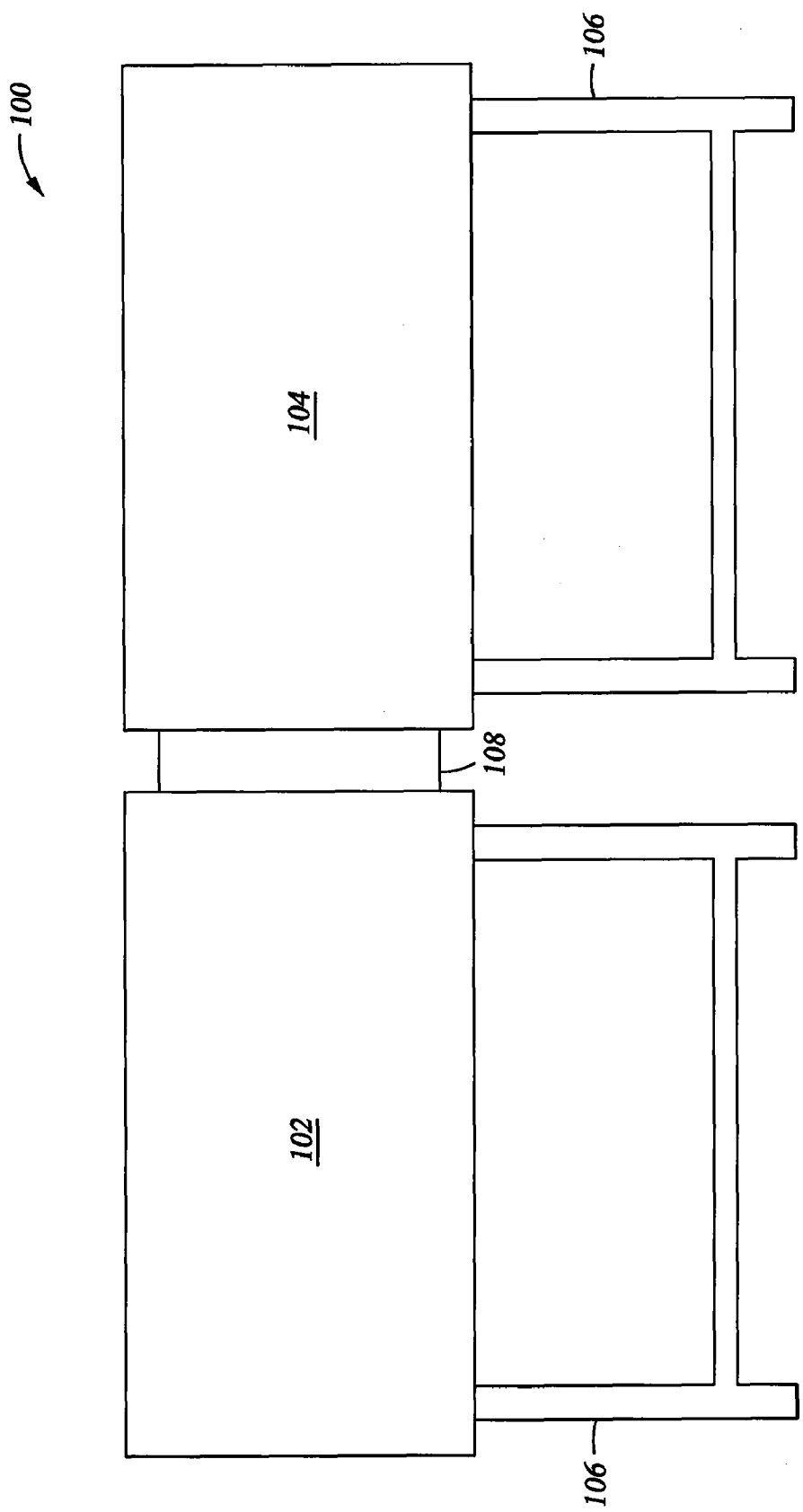
FIG. 1 is a schematic diagram of a slit valve disposed between two chambers.

FIG. 1 is a schematic diagram of a slit valve 108 disposed between a transfer chamber 102 and a process chamber 104. A processing system 100 may comprise one or more process chambers 104 coupled to a transfer chamber 102. A slit valve 108 may be disposed between the transfer chamber 102 and the process chamber 104. It is to be understood that while only one process chamber 104 has been shown coupled with the transfer chamber 102, multiple process chambers 104 may be coupled with the transfer chamber 102. At each point where a process chamber 104 couples with the transfer chamber 102, a slit valve 108 may be coupled therebetween. Similarly, when any two chambers are coupled together, a slit valve 108 may be coupled therebetween.

The process chamber 104 may be any suitable process chamber 104 for processing substrates such as a plasma enhanced chemical vapor deposition (PECVD) chamber, a physical vapor deposition (PVD) chamber, or other chamber. The substrates processed may be semiconductor substrates, flat panel display substrates, solar panel substrates, or any other substrate. Within each process chamber 104, one or more substrates may be processed.

Figure 2:
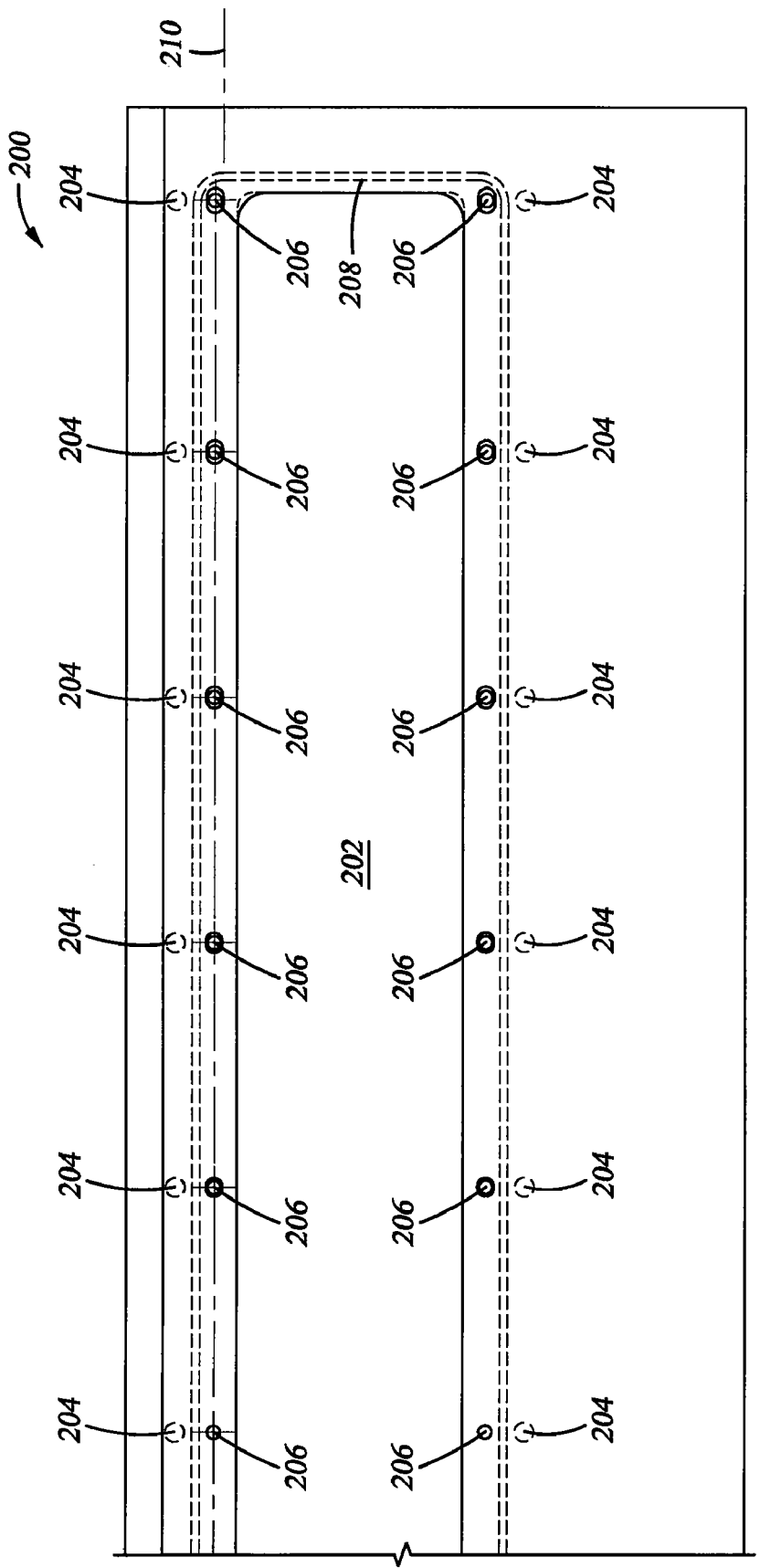
FIG. 2 is a front view of an interface between a slit valve and a transfer chamber looking through the transfer chamber according to one embodiment of the invention.

FIG. 2 is a front view of an interface 200 between a slit valve and a transfer chamber looking through the transfer chamber according to one embodiment of the invention. When the slit valve is open, an opening 202 is present between the transfer chamber and the process chamber to permit passage of one or more substrates therebetween. The slit valve may be sealed to the transfer chamber by one or more O-rings 208. One or more spacers 204 may be present between the transfer chamber and the slit valve. Additionally, one or more fasteners 206 may be coupled between the slit valve and the transfer chamber. The one or more fasteners 206 may be disposed along a common axis 210.

Figure 3:
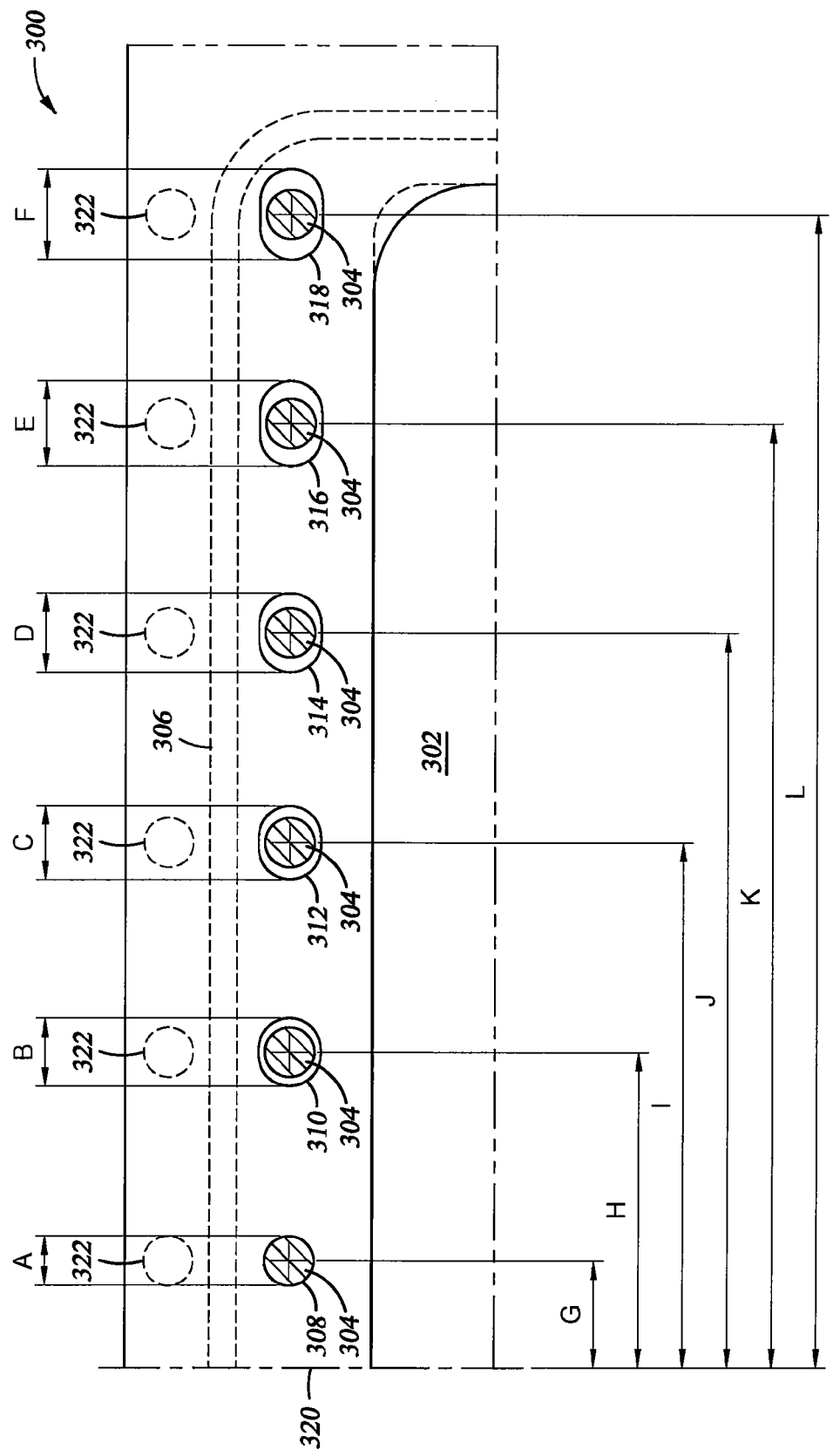
FIG. 3 is a front view of an interface between a slit valve and a transfer chamber looking through the transfer chamber in which the slit valve has not been thermally expanded and/or vacuum deformed according to one embodiment of the invention.

FIG. 3 is a front view of an interface 300 between a slit valve and a transfer chamber looking through the transfer chamber in which the slit valve has not been thermally expanded and/or vacuum deformed according to one embodiment of the invention. As noted above, one or more O-rings 306 may be disposed between the slit valve and the transfer chamber to seal the transfer chamber to the slit valve. Additionally, one or more spacers 322 may be present between the transfer chamber and the slit valve. The one or more spacers 322 move with the slit valve when the slit valve moves relative to the transfer chamber. The one or more spacers 322 reduce the opportunity for the slit valve and the transfer chamber to rub against each other and generate particles that may contaminate any substrates. When the slit valve is opened, one or more substrates may pass through the opening 302 between the transfer chamber and the processing chamber.

One or more fastening mechanisms 304 may additionally couple the transfer chamber to the slit valve. In one embodiment, each fastening mechanism may be aligned with a corresponding spacer 322. Each fastening mechanism 304 may be disposed within a slot 308, 310, 312, 314, 316, 318 disposed through the transfer chamber. It is to be understood that while six slots 308, 310, 312, 314, 316, 318 have been shown, more or less slots 308, 310, 312, 314, 316, 318 may be present. For example, one or more slots may be present below the opening 302 between the process chamber and the transfer chamber. Additionally, one or more slots may be present on the other side of the center 320 of the interface 300.

During substrate processing, the processing chamber or adjacent chamber may be heated to a temperature greater than about 300 degrees Celsius. Due to conduction, the slit valve may also be heated. In one embodiment, the slit valve may be conductively heated to a temperature of about 120 degrees Celsius to about 200 degrees Celsius. In another embodiment, the slit valve may be conductively heated to a temperature of about 120 degrees Celsius to about 130 degrees Celsius. Because the slit valve is heated, the slit valve may expand. Once the slit valve cools, it may then contract. Conversely, the transfer chamber, because it may not be directly coupled to the process chamber but instead may be directly coupled to the slit valve, may not experience a significant amount of thermal expansion/contraction. Hence, the slit valve may expand and contract relative to the transfer chamber. Due to the expansion and contraction of the slit valve relative to the relatively stationary transfer chamber, the slit valve may be permitted to slide along the interface 300 between the transfer chamber and the slit valve. Similarly, when a vacuum is drawn in the process chamber, the slit valve may deform relative to the transfer chamber due to the vacuum pressure exerted on the slit valve.

Due to the thermal expansion/contraction and/or vacuum deformation, the slit valve may expand and/or contract relative to the transfer chamber. Thus, the fastening mechanisms 304 and spacers 322 may move with the slit valve as the slit valve expands and contracts relative to the transfer chamber. The further the distance away from the center 320 of the interface 300, the greater than amount of expansion that the slit valve may have and hence, the greater the amount of movement that the fastening mechanisms 304 and spacers 322 may have. Therefore, the slots 308, 310, 312, 314, 316, 318 in the transfer chamber may be successively larger the further distance away from the center 320 of the interface 300.

Slot 308 closest to the center 320 of the interface 300 has a width represented by arrows A and may have little room for movement of the fastening mechanism 304 due to the proximity of the slot 308 to the center 320. The center of the fastening mechanism 304 in slot 308 may be positioned a distance G from the center 320 of the interface 300. Slot 310, which has a width represented by arrows B, may be spaced a greater distance H from the center 320 of the interface 300 than slot 308. The width B of slot 310 may be greater than the width A of slot 308.

Slot 312, which has a width represented by arrows C, may be spaced a greater distance I from the center 320 of the interface 300 than slot 310. The width C of slot 312 may be greater then the width B of slot 310. Slot 314, which has a width represented by arrows D, may be spaced a greater distance J from the center 320 of the interface 300 than slot 312. The width D of slot 314 may be greater then the width C of slot 312. Slot 316, which has a width represented by arrows E, may be spaced a greater distance K from the center 320 of the interface 300 than slot 314. The width E of slot 316 may be greater then the width D of slot 314. Slot 318, which has a width represented by arrows F, may be spaced a greater distance L from the center 320 of the interface 300 than slot 316. The width F of slot 318 may be greater then the width E of slot 316. Thus, the further the distance from the center 320 of the interface 300, the larger the slot.

Figure 4:
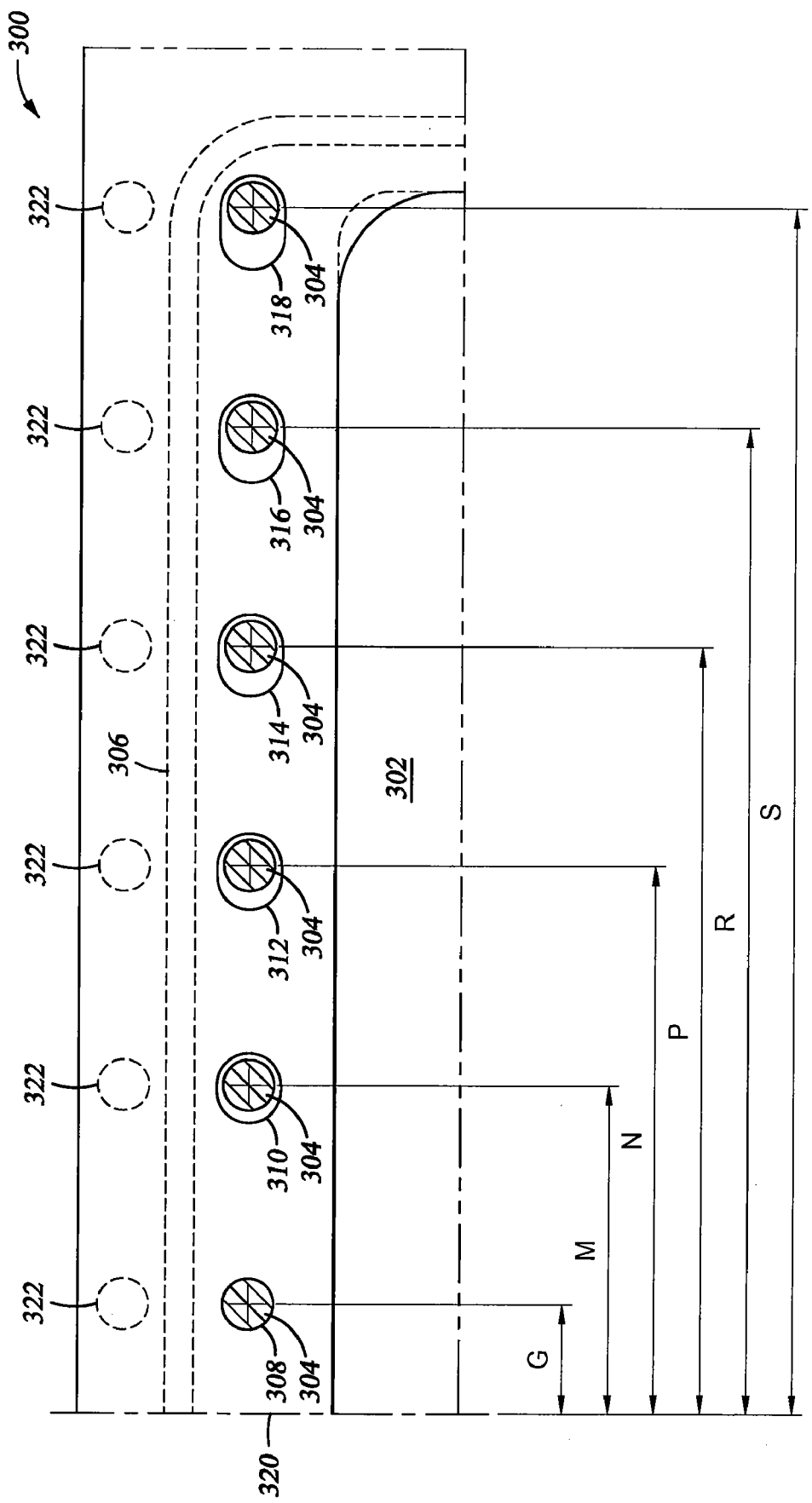
FIG. 4 is a front view of the interface between the slit valve and the transfer chamber of FIG. 3 in which the slit valve has been thermally expanded and/or vacuum deformed according to one embodiment of the invention.

FIG. 4 is a front view of the interface 300 between the slit valve and the transfer chamber of FIG. 3 in which the slit valve has been thermally expanded and/or vacuum deformed according to one embodiment of the invention. The fastening mechanisms 304 have moved relative to the transfer chamber due to the thermal expansion and/or vacuum deformation of the slit valve. The movement of the fastening mechanisms 304 relative to the transfer chamber is shown by the distance that the fastening mechanisms 304 have moved within the slots 310, 312, 314, 316, 318 of the transfer chamber. The fastening mechanism 304 in slot 308 may not have appreciably moved relative to the transfer chamber due to its proximity to the center 320 of the interface 300. Hence, the fastening mechanism 304 in slot 308 remains substantially at distance G from the center 320 of the interface 300. However, the fastening mechanisms 304 in each of the other slots 310, 312, 314, 316, 318 have moved relative to the transfer chamber due to the thermal expansion of the slit valve.

The center of the fastening mechanism 304 disposed in slot 310 may be a distance M from the center 320 of the interface 300. The distance M is greater than the distance H. The center of the fastening mechanism 304 disposed in slot 312 may be a distance N from the center 320 of the interface 300. The distance N is greater than the distance I. The center of the fastening mechanism 304 disposed in slot 314 may be a distance P from the center 320 of the interface 300. The distance P is greater than the distance J. The center of the fastening mechanism 304 disposed in slot 316 may be a distance R from the center 320 of the interface 300. The distance R is greater than the distance K. The center of the fastening mechanism 304 disposed in slot 318 may be a distance S from the center 320 of the interface 300. The distance S is greater than the distance L. Additionally note that the spacers 322 have also moved. The spacers 322 slide along the transfer chamber during expansion/contraction/deformation.

By permitting the slit valve to move relative to the transfer chamber, the O-ring 306 may remain sealed to the transfer chamber. Absent the ability to move in relation to the transfer chamber, the slit valve may buckle due to the need to expand when conductively heated, damage the O-ring, and unseal from the transfer chamber.

Figure 5:
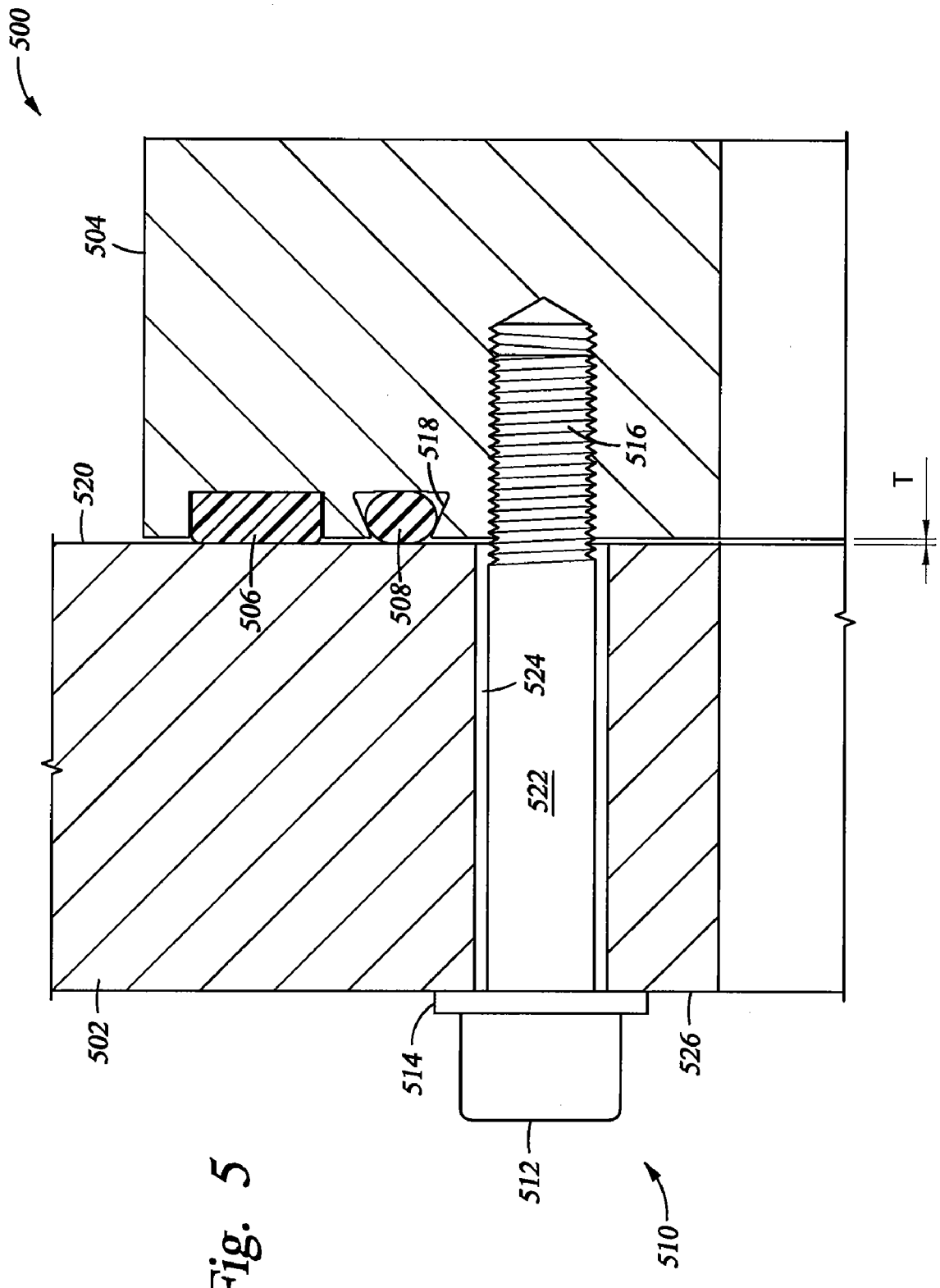
FIG. 5 is a cross sectional view of an interface between a transfer chamber and a slit valve according to one embodiment of the invention.

FIG. 5 is a cross sectional view of an interface 500 between a transfer chamber 502 and a slit valve 504 according to one embodiment of the invention. An O-ring 508 may be disposed between the transfer chamber 502 and the slit valve 504. The O-ring 508 may be partially disposed within a groove 518 in the slit valve 504. One or more spacers 506 may be disposed between the slit valve 504 and the transfer chamber 502. The one or more spacers 506 may be countersunk into the slit valve 504 and extend a distance T outside the slit valve.

The one or more spacers 506 may comprise a low friction and low thermal conductivity material. In one embodiment, the low friction and low thermal conductivity material may comprise ceramics, engineering plastic, polyamide, polyimide, NiB coated metal, $WS_2$ coated metal, and combinations thereof. In one embodiment, the metal comprises stainless steel. The low thermal conductivity of the material reduces the amount of heat conducted from the slit valve to the transfer chamber. The low friction permits the spacers 506 to slide along the side 520 of the transfer chamber that interfaces with the slit valve 504. The spacer 506 may slide along the side 520 of the transfer chamber 502 when the slit valve 504 moves due to thermal expansion/contraction and/or vacuum deformation. The spacer 506 may also slide along the side 520 of the transfer chamber 502 when the slit valve contracts.

The one or more spacers 506 may be disposed on the atmospheric side of the O-ring 508. Because the spacers 506 are on the atmospheric side of the O-ring 508, any particles generated by the spacers 506 and/or the side 520 of the transfer chamber 502 as the spacers 506 slide along the side 520 of the transfer chamber 502 may not enter into the processing space contained within the transfer chamber 502 and processing chamber and contaminate the process. The spacers 506 may help to maintain a distance T between the transfer chamber 502 and the slit valve 504. Maintaining a distance T between the transfer chamber 502 and the slit valve 504 reduces the likelihood that the slit valve 504 and the transfer chamber 502 may rub against each other when the slit valve 504 thermally expands/contracts and/or vacuum deforms. If the slit valve 504 and the transfer chamber 502 rub against each other, particles may flake off the slit valve 504, transfer chamber 502, or both. The particles may contaminate the substrate. The distance T may be set based upon the expected thermal expansion/contraction and/or vacuum deformation of the slit valve 504. The distance T may be of sufficient distance to permit an effective vacuum seal between the slit valve 504 and the transfer chamber 502 while reducing the likelihood of the transfer chamber 502 and slit valve 504 rubbing against each other.

A fastening mechanism 510 may additionally couple the slit valve 504 to the transfer chamber 502. The fastening mechanism 510 may comprise a threaded portion 516 threadedly coupled with the slit valve 504. A smooth portion 522 may be disposed within the slot 524 extending through the transfer chamber 502. The smooth portion 522 may move within the slot 524 as the slit valve 504 thermally expands and/or vacuum deforms and slides along the side 520 of the transfer chamber 502. The fastening mechanism 510 may comprise a cap portion 512 having a flange portion 514. The flange portion 514 may rest against a side 526 of the transfer chamber 502. The flange portion 514 may prevent the fastening mechanism 510 from over tightening and pinching the slit valve 504 to the transfer chamber 502. The combination of the spacer 506 and the flange 514 resting against a side 526 of the transfer chamber 502 may help to maintain the distance T between the transfer chamber 502 and the slit valve 504. The combination of the spacer 506 and the flange 514 resting against a side 526 of the transfer chamber 502 may also help to seal the O-ring 508 between the transfer chamber 502 and the slit valve 504.

By compensating for expected thermal expansion/contraction and/or vacuum deformation of the slit valve during processing, a slit valve may not buckle or rub against an adjacent chamber and produce harmful contaminants. Without the buckling of the slit valve or rubbing against adjacent chambers, an effective seal may be maintained between the slit valve and the chamber.

While the foregoing is directed to embodiments of the present invention, other and further embodiments of the invention may be devised without departing from the basic scope thereof, and the scope thereof is determined by the claims that follow.

The invention claimed is:

1. A slit valve, comprising:
a slit valve body having an opening therethrough, the opening sized to permit passage of a substrate through the opening, the body also having a first groove formed into a surface of the body and circumscribing the opening, the body also having a plurality of second grooves formed into a same surface of the body as the first groove and disposed radially outside of the first groove, the plurality of second grooves extending along a substantially linear path, the body also having a plurality of coupling locations disposed radially outside of the opening and radially inside the first groove, the coupling locations adapted to receive a threaded portion of a fastening mechanism.

2. The slit valve of claim 1, wherein the plurality of coupling locations are disposed along a common axis.

3. The slit valve of claim 1, further comprising one or more spacer elements disposed in at least one of the plurality of second grooves.

4. The slit valve of claim 3, wherein the one or more spacer elements comprise at least one material selected from the group consisting of ceramic, polyamide, polyimide, NiB, $WS_2$, and combinations thereof.

5. The slit valve of claim 3, wherein the one or more spacer elements comprise stainless steel.

6. The slit valve of claim 5, wherein the stainless steel is coated with a material selected from the group consisting of NiB, $WS_2$, and combinations thereof.

* * * * *